(12) United States Patent
Sridhara et al.

(10) Patent No.: US 10,177,791 B1
(45) Date of Patent: Jan. 8, 2019

(54) SYNDROME UPDATE AND MAINTENANCE

(71) Applicant: Seagate Technology LLC, Cupertino, CA (US)

(72) Inventors: Deepak Sridhara, Longmont, CO (US); Ara Patapoutian, Hopkinton, MA (US)

(73) Assignee: Seagate Technology LLC, Cupertino, CA (US)

(*) Notice: Subject to any disclaimer, the term of this patent is extended or adjusted under 35 U.S.C. 154(b) by 0 days.

(21) Appl. No.: 15/346,651

(22) Filed: Nov. 8, 2016

(51) Int. Cl.
*H03M 13/29* (2006.01)
*H03M 13/15* (2006.01)

(52) U.S. Cl.
CPC ... *H03M 13/2906* (2013.01); *H03M 13/1575* (2013.01)

(58) Field of Classification Search
CPC ............. H03M 13/2906; H03M 13/1575
See application file for complete search history.

(56) References Cited

U.S. PATENT DOCUMENTS

| | | | | |
|---|---|---|---|---|
| 5,687,182 A * | 11/1997 | Shikakura | .......... | G11B 20/1833 714/704 |
| 6,370,324 B1 * | 4/2002 | Kawahara | ........ | G11B 20/00007 348/705 |
| 6,526,224 B1 * | 2/2003 | Kawahara | ............ | G11B 27/005 375/E7.021 |
| 8,570,679 B2 | 10/2013 | Wu et al. | | |
| 8,760,986 B2 | 6/2014 | Reddy et al. | | |
| 8,910,026 B2 | 12/2014 | Patapoutian et al. | | |
| 8,976,476 B1 | 3/2015 | Lu et al. | | |
| 2004/0098661 A1 * | 5/2004 | Chuang | .............. | G11B 20/1833 714/784 |
| 2004/0123214 A1 * | 6/2004 | Seki | ....................... | H03M 13/29 714/753 |
| 2012/0278679 A1 | 11/2012 | Rub et al. | | |
| 2013/0275829 A1 | 10/2013 | Sridhara | | |
| 2014/0172934 A1 | 6/2014 | Yang et al. | | |
| 2015/0222294 A1 * | 8/2015 | Eroz | ..................... | H03M 13/27 714/776 |

* cited by examiner

*Primary Examiner* — Kyle Vallecillo
(74) *Attorney, Agent, or Firm* — Cesari & Reed, LLP; Kirk A. Cesari; Logan Brown

(57) ABSTRACT

An apparatus may include a circuit that performs one or more read and recovery operations for one or more data segments including updating an outer code syndrome for one or more recovered data segments recovered by the one or more read and recovery operations and preventing updates of the outer code syndrome for one or more failed data segments not recovered by the one or more read and recovery operations.

20 Claims, 13 Drawing Sheets

SYNDROME UPDATE AND MAINTENANCE

SUMMARY

An apparatus may include a circuit that performs one or more read and recovery operations for one or more data segments including updating an outer code syndrome for one or more recovered data segments recovered by the one or more read and recovery operations and preventing updates of the outer code syndrome for one or more failed data segments not recovered by the one or more read and recovery operations.

An apparatus may include a circuit configured to update an uncontaminated outer code syndrome associated with one or more requested data segments based on data from failed data segments to generate a contaminated outer code syndrome. The circuit may perform a recovery operation based on the contaminated outer code syndrome including updating the contaminated outer code syndrome using data from one or more recovered data segments of the failed data segments which were recovered by the recovery operation. In addition, the circuit may cancel a contribution of one or more failed segments which the recovery operation failed to recover to generate an updated uncontaminated outer code syndrome.

An apparatus may include a circuit configured to initialize a read operation to read one or more requested data segments of a respective data unit. The circuit may also add a miscorrected data segment to a list of data segments to be skipped based at least in part on a number of miscorrections of the miscorrected data segment.

These and other features and benefits that characterize various embodiments of the disclosure can be understood in view of and upon reading the following detailed description and review of the associated drawings.

DETAILED DESCRIPTION

Figure 1:
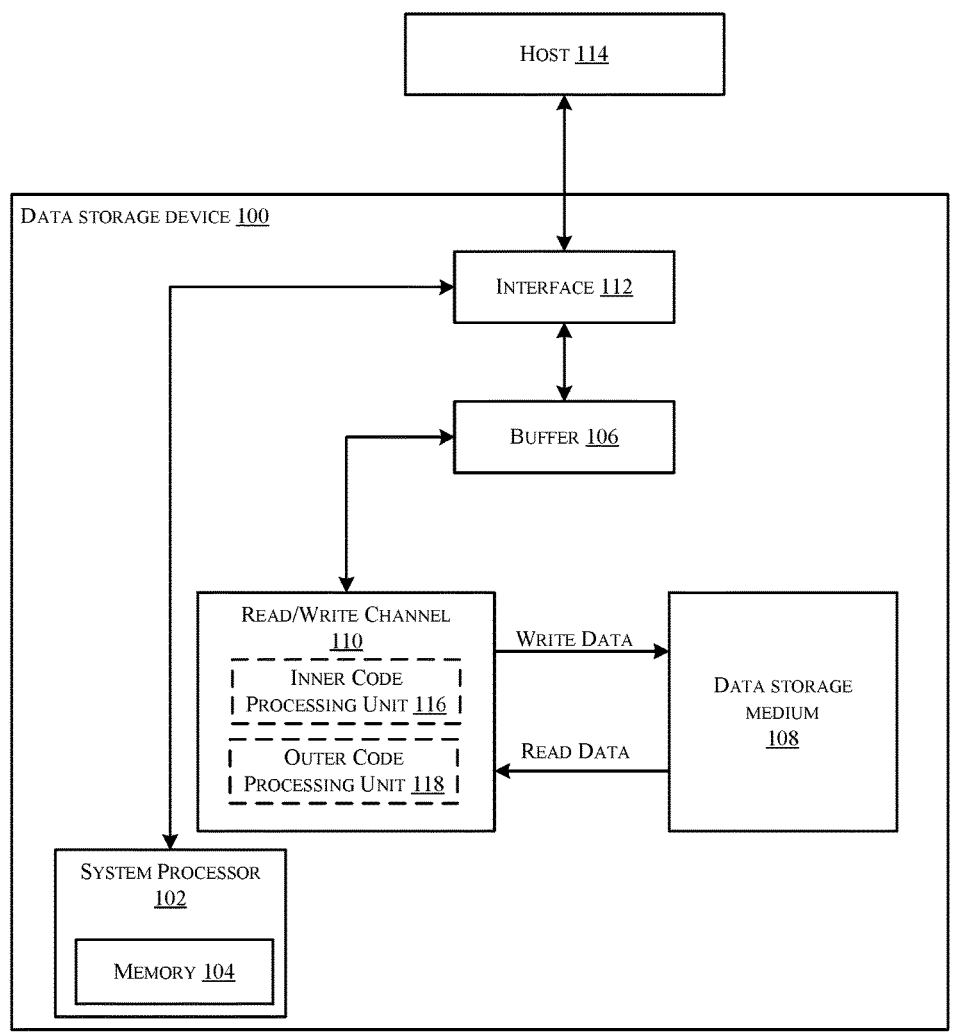
FIG. 1 is a simplified block diagram of an exemplary data storage device, in accordance with certain embodiments of the present disclosure.

In the following detailed description of the embodiments, reference is made to the accompanying drawings which form a part hereof, and in which are shown by way of illustrations. It is to be understood that features of the various described embodiments may be combined, other embodiments may be utilized, and structural changes may be made without departing from the scope of the present disclosure. It is also to be understood that features of the various embodiments and examples herein can be combined, exchanged, or removed without departing from the scope of the present disclosure.

In accordance with various embodiments, the methods and functions described herein may be implemented as one or more software programs running on a computer processor or controller. In accordance with another embodiment, the methods and functions described herein may be implemented as one or more software programs running on a computing device, such as a personal computer that is using a disc drive. Dedicated hardware implementations including, but not limited to, application specific integrated circuits, programmable logic arrays, and other hardware devices can likewise be constructed to implement the methods and functions described herein. Further, the methods described herein may be implemented as a computer readable storage medium or device including instructions that when executed cause a processor to perform the methods.

Embodiments of the disclosure may provide a method and apparatus for recovering data on a storage medium. When data is requested by a host from a storage device such as a hard drive, the requested data (e.g., incoming or read data) may be checked to ensure that it is error free. For example, a syndrome, such as an outer code syndrome, may be generated for a portion of requested data to indicate whether it contains errors. In some embodiments, the syndrome may be utilized to detect errors once the full data unit or outer code block is read. Requested data that contains errors (in other words, the requested data may not be error free) may result in what may be referred to as a data failure (e.g., a segment/sector failure, a unit/track failure, etc.). Such requested failed data may then be decoded using various decoding techniques and/or the requested failed data may be attempted to be re-read from the storage medium. Some embodiments herein may relate to efficiently maintaining and updating the outer code syndrome during reads and various recovery processes so that, for example, the outer code syndrome need not be reconstructed prior to outer code recovery. Some embodiments may further relate to handling the outer code syndrome, for example, when segments are miscorrected and the miscorrection is not detected until after the outer code syndrome is contaminated with the miscorrected data.

In general, a code may include rules for converting a piece of information into another representation (e.g., one symbol into another symbol). A code word may be an element of a code. Each code word may include a sequence of assembled symbols that may correspond with the rules of the code. For example, codes may be used in the error-correction of data. These types of codes, often described as channel codes, may contain redundancy that may provide for the communication of more reliable data, for example, in the presence of noise. One example error-correcting code is a concatenated code. Concatenated codes may be derived by using an inner code and an outer code.

Outer codes may improve the tolerance to defects, for example, by allowing one or more inner code failures. The size of a defect that can be corrected may be closely related to the code overhead (e.g., amount of parity in the outer code). Therefore, an outer code with a longer code word may achieve the desired defect coverage with less relative overhead. Having an outer code that can recover inner code failures may also allow the inner code to be optimized for random error performance. LDPC (low density parity check) codes (which may generally be included in an inner code) may trade off performance to lower the error floor below the unrecoverable error rate. With an outer code as a safety mechanism, the error floor may be relaxed and LDPC codes may be optimized for performance.

Outer codes may be implemented by XOR-ing data across all inner code words. Such an implementation may provide the capability to recover from a single inner code word failure. In some such implementations, the signal-to-noise (SNR) gain for the overhead expended may be relatively small. In some implementation, outer codes may be derived based on Reed-Solomon codes. Such codes may allow for multiple inner code failures and may offer a significant SNR benefit for random errors. Furthermore, outer codes may "average out" the SNR variability. In sequential writing, many sources of variability may be removed. For example, degraded signals due to adjacent track interference (ATI) or adjacent track erasure (ATE) may be greatly diminished because repeated writes to adjacent or neighboring tracks may be eliminated. However, variability in regards to SNR, for example, due to transducer positioning, may occur. Outer codes (or very long code words) may exceed the time constants of the SNR variability and may offer the "averaged out" SNR variability.

FIG. 1 is a simplified block diagram of an exemplary data storage device 100 that can be used in embodiments described herein. Data storage device 100 includes a system processor 102, which is used for controlling certain operations of data storage device 100. The various operations of data storage device 100 are controlled by system processor 102 with the use of programming stored in memory 104, which may be, for example, a dynamic random access memory (DRAM), in some embodiments. System processor 102 may be coupled to a buffer 106 through an optional read/write channel 110. Buffer 106 can temporarily store user data during read and write operations and may include the capability of temporarily storing access operations pending execution by system processor 102.

System processor 102 may execute read and write operations on data storage medium 108. In one embodiment, system processor 102 may also be used for carrying out data recovery from data storage medium 108. In some embodiments, data storage medium 108 may be one or more magnetic discs. In other embodiments, data storage medium 108 can be a collection of solid-state memory elements. These read/write operations executed by system processor 102 may be performed directly on data storage medium 108 or through optional read/write channel 110.

Read/write channel 110 may receive data from system processor 102 during a write operation, and may provide encoded write data to data storage medium 108. During a read operation, read/write channel 110 may process a read signal in order to detect and may decode data recorded on data storage medium. The decoded data may be provided to system processor 102 and ultimately through an interface 112 to an external host 114. In some embodiments, the channel 110 may include the optional inner code processing unit 116 and outer code processing unit 118 and operations of the channel 110 discussed herein regarding inner and outer code recovery and the outer code syndrome may be performed by one or both of the inner code processing unit 116 and outer code processing unit 118.

External host 114 may be a processor in an electronic device, such as a processor in a computing device. Although FIG. 1 illustrates external host 114 as being a single host, data storage device 100 may be connected through interface 112 to multiple hosts. Through interface 112, data storage device 100 may receive data and commands from external host 114 and may provide data and error codes to external host 114 based on commands executed by system processor 102.

Data storage medium 108 may include a plurality of data units. Each data unit may be subdivided into a plurality of storage segments. As defined herein, a storage segment may be the basic unit of data storage on data storage medium 108. The storage segments may be identified and located at various positions on medium 116.

Figure 2:
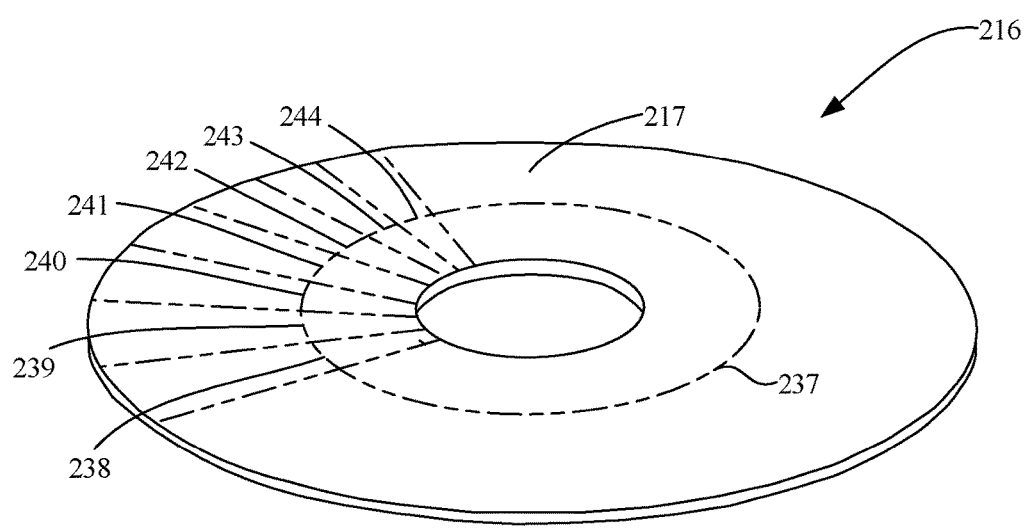
FIG. 2 illustrates an exemplary perspective view of a storage medium, in accordance with certain embodiments of the present disclosure.

As previously discussed, data storage medium 108 may include one or more magnetic discs. FIG. 2 illustrates such an exemplary disc storage medium 216. In FIG. 2, storage medium 216 may include a surface 217 having a plurality of substantially concentric circular tracks (e.g., data units), such as data track 237. In some embodiments, the data tracks on storage medium 216 may be logically divided into a plurality of data storage sectors (e.g., storage segments). Each storage sector may be identified and located at various positions on disc 216. In the disc-type medium example illustrated in FIG. 2, storage segments or data sectors may be "pie-shaped" angular sections of a track that are bounded on two sides by radii of the disc and on the other side by the perimeter of a circle that may define the track. For example, data track 237 may be logically divided into data sectors 238-244.

Each track or data unit may have a related logical block addressing (LBA). For disc-type storage media, the LBA may include a cylinder address, head address and sector address. A cylinder may identify a set of specific tracks on the disc surface of each disc 116 which may lie at equal radii and may generally be simultaneously accessible by a collection of transducing heads in a data storage device. The head address may identify which head can read the data and therefore may identify which disc from the plurality of discs 216 the data is located on. As mentioned above, each track within a cylinder may be further divided into sectors for storing data. The data sector may be identified by an associated sector address.

With reference back to FIG. 1 and in embodiments described in more detail below, system processor 102 may implement a two-level parity encoding system to detect and correct data errors. These embodiments may organize data into two sets of groupings in which the first set of grouping may be encoded by an inner code and the second set of grouping may be encoded by an outer code.

Figure 3:
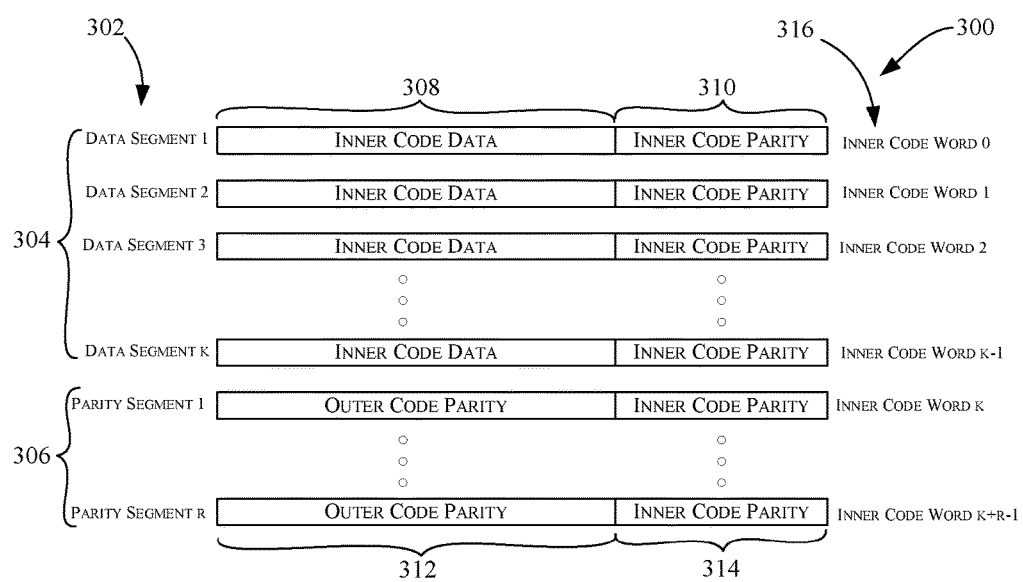
FIG. 3 illustrates a diagrammatic view of a data unit and its organized groupings of data into inner and outer codes, in accordance with certain embodiments of the present disclosure.

FIG. 3 illustrates a diagrammatic view of an embodiment of a data unit 300 and the organization of groupings of data into inner and outer codes. Data unit 300 may include a plurality of segments 302 for storing user data and/or parity data. The rows in FIG. 3 may represent a segment 302 in data unit 300 and may also represent one grouping in the first set of groupings being encoded by an inner code.

Segments 302 may be further divided into k number of segments 304 and r number of segments 306, wherein k and r may be integers greater than or equal to 1. Each of the k number of segments 304 may include a first portion 308, which may contain user data encoded by the inner code. Each of the k number of segments 304 may also include a second portion 310, which may contain inner code parity data encoded by an inner code. This inner code parity 310 may provide inner code protection against errors in the segment to which it belongs. More specifically, inner code parity 310 may provide protection against errors in the inner code data 308. Recovery using inner code parity may be referred to inner code recovery herein.

Each of the r number of segments 306 may include a first portion 312, which may contain parity data encoded by the outer code. Each of the r number of segments 306 may also include a second portion 314, which may contain inner code parity data encoded by the inner code. The outer code parity 312 may provide outer code protection against inner code failures, while the inner code parity 314 of r number of segments 306 may provide inner code protection against errors in the segment to which it belongs. More specifically, the inner code parity 314 may provide protection against errors in the outer code parity 312. Therefore, each row of segments may be considered to be an inner code word 316 starting with inner code word 0 and ending with inner code word k+r−1. Recovery of segments using outer code parity may be referred to herein as outer code recovery.

Any number of segments 306 (as represented by rows) may be provided for the outer code. The more segments that are provided for the outer code, the more errors that may be detected and may be corrected by the outer code parity 312. However, increasing the number of segments for the outer code and thereby increasing the number of parity data symbols, may come at the cost of reduced storage capacity of user data. As illustrated in FIG. 3 and for example, if the k number of segments is equal to 20 and the r number of segments is equal to 10, the outer code parity 312 may be capable of correcting a total of 10 errors in the 30 total segments which could be affected. It should be realized that errors may occur both in segments 304 as well as in segments 306.

In some embodiments, each of the plurality of segments 302 may be indicated by a row in FIG. 3 is associated with a logical block address (LBA). Each LBA may designate an address for the row of inner code data and inner code parity on a storage medium. In embodiments in which a magnetic disc provides the storage medium, the LBA can be the LBA of a data sector of a data track on the storage medium.

Figure 4:
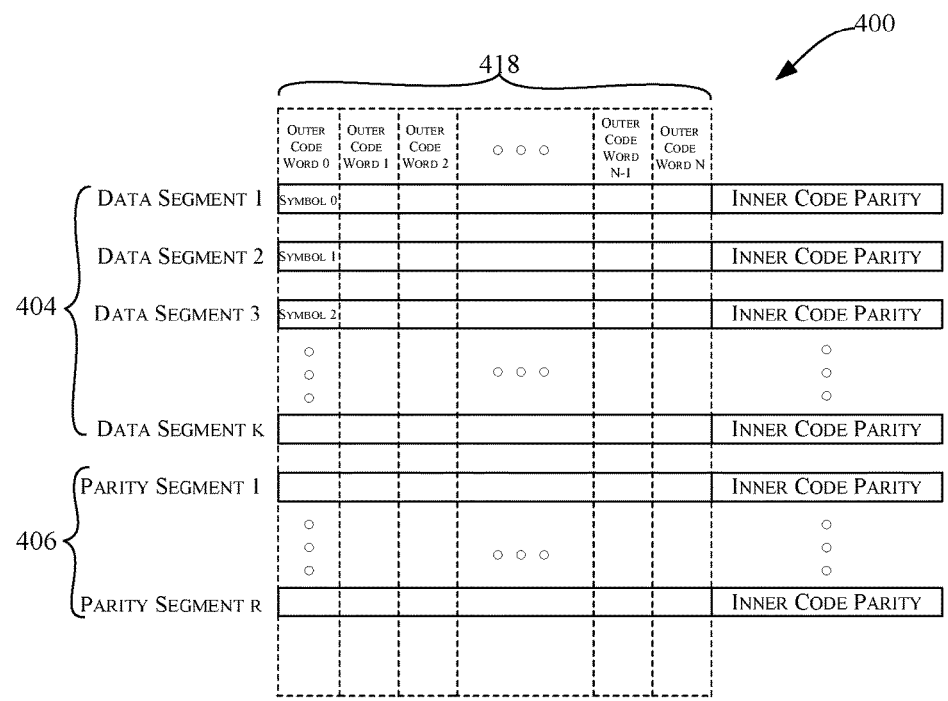
FIG. 4 illustrates a diagrammatic view of a data unit and its organized groupings of data into inner and outer codes based on a Reed-Solomon scheme, in accordance with certain embodiments of the present disclosure.

FIG. 4 illustrates a diagrammatic view of an embodiment of a data unit 400 and the organization of groupings of data into inner and outer codes based on a Reed-Solomon (RS) scheme. With a RS outer code, the unit of correction may be a symbol. A symbol may contain multiple bits of data. More specifically, the r number of segments 406 may be associated with the k number of segments 404 to derive a plurality of symbol-based outer code words 418. Each outer code word 418 may contain m number of symbols from each segment for correcting m number of symbols in each outer code word 418, wherein m is an integer greater than or equal to 1. For purposes of simplification, FIG. 4 may illustrate Reed-Solomon outer code words 418 having one symbol per segment (e.g., m=1).

Using the RS outer code illustrated in FIG. 4, it may be possible, in some instances, for more than the r number of inner code failures to be corrected. Even if inner code words are not recoverable, most of the bits or symbols of the inner code words may be correct. Similarly, symbols in outer code words that may be contained in failing inner code words may be mostly error-free and many outer code words can be corrected. More specifically, an outer code having r number of segments 406 can correct r number of inner code failures using erasures, where an erasure may be referred to as knowing the location of a symbol. However, the outer code can correct many outer code words 418 without using erasures. In some examples, when the location of the errors is unknown for the outer code, the number of errors that can be corrected may be less than r. This may be the case in some examples during IOC recovery.

For IOC recovery of a set of failed segments, the equalized samples from the channel may be sent to an inner decoder (e.g., a low density parity check (LDPC) decoder using LDPC codes) and the inner code may generate hard decisions (also referred to herein as hard data), which may form the decoding output. This hard data may be sent to the outer decoder and stored in memory. The outer decoder (e.g., a Reed Solomon (RS) decoder using RS code words) may use these hard decisions and may generate a new set of hard data that may be updated in memory and sent back to the inner decoder. The IOC recovery process may be repeated iteratively. The starting point of IOC recovery may involve a skip read of the segment(s) to be recovered and the generating of equalized samples for these segments to be used in the IOC recovery process.

In some embodiments, an outer code syndrome update process may be implemented that may build the syndrome at each read or error recovery process with data of recovered segments until invocation of a process that may utilize the OC syndrome with failed segment information. The error recovery process may ensure that the syndrome update from a recovered sector is not lost in later error recovery processes.

In some examples, a syndrome in the case of an outer code block with one parity sector using XOR-based parity may be calculated as U1+U2+ . . . +Uk+P0=0 where U1, U2, . . . Uk are the user segments and P0 is the parity segment. A syndrome block may be equivalent in length to one segment and may be maintained in the channel. The outer code syndrome block in such an example may be updated by XOR-ing the bits of each recovered segment with the current state of the outer code syndrome block as the segments are recovered. In some examples, the contribution of a segment to the syndrome block may be removed by applying the data of the segment to the outer code syndrome block a second time or an even number of times.

Once the segments of the outer code block are read and the outer code syndrome block is updated in this manner, the channel may be able to recover one failed segment using the syndrome state (e.g. in the case of one parity segment).

For more than one parity segment, the process may be similar. In such cases, the outer code syndrome block may have a data segment for each parity segment of the outer code block. Similarly, each parity segment may have an associated weighted XOR. For example, the weighted XORs for two parity segments may be represented and calculated as:

$$a1U1+a2U2+ \ldots +ak\ Uk+P1=0$$

$$b1U1+b2U2+ \ldots +bk\ Uk+P1=0$$

where U1, U2, Uk are the user segments, P0 and P1 are the parity segments, a1, a2, . . . ak are the coefficients or weights for a first weighted XOR and b1, b2, . . . bk are the coefficients or weights for a second weighted XOR. Using the weighted XORs, a syndrome state for each parity segment may be maintained in the associated data segment of the outer code syndrome block. Of course, weighted XORs are merely an example function usable in syndrome and other embodiments may utilize other functions which would be apparent to one of ordinary skill in the art in view of this disclosure.

As mentioned above, in some example embodiments of the disclosed subject matter, the channel may update the outer code syndrome block with data from recovered segments while preventing updates of the OC syndrome block with data from failed segments (e.g. until a process that may utilize the OC syndrome with failed segment information is invoked).

Once a process that may utilize the OC syndrome with failed segment information is invoked (e.g. IOC recovery), embodiments may include a mechanism to update the OC syndrome with failed segment data, perform the process, and to undo the syndrome contribution of failed sectors that remain after the recovery attempt. In this way, the syndrome state may remain consistent with data from the recovered sectors. As such, the system may invoke outer code recovery or other recovery processes that rely on the OC syndrome at any stage in the error recovery process.

Figure 5:
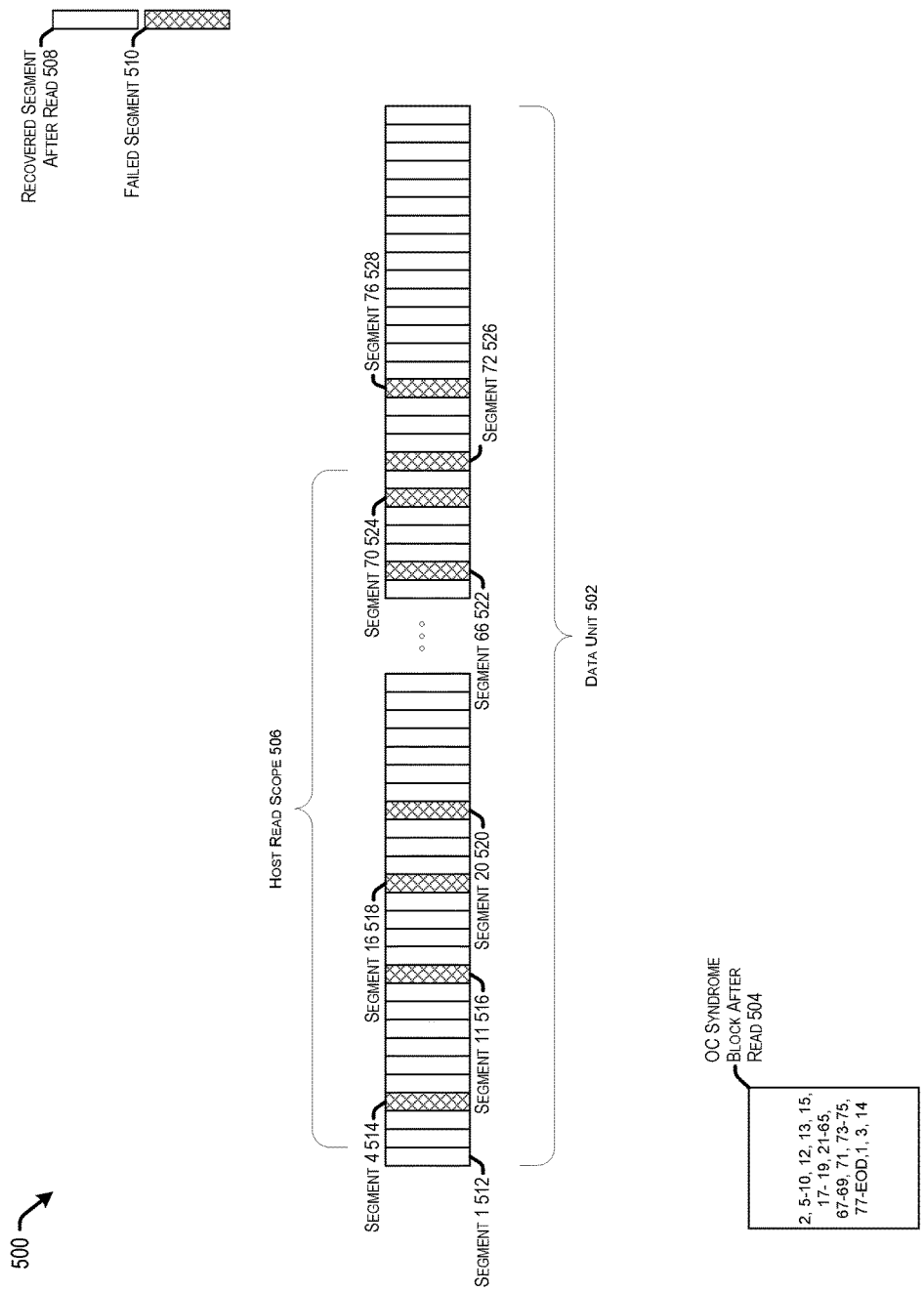
FIG. 5 illustrates a diagrammatic view of an embodiment of a data unit and an OC syndrome block, in accordance with certain embodiments of the present disclosure.

FIG. 5 illustrates a diagrammatic view 500 of an embodiment of a data unit 502 and an OC syndrome block 504. In the illustrated view, each block in the data unit 502 may represent a segment of the data unit 502 (or an outer code block). For example, the segments of data unit 502 may represent the data segments and parity segments of the data unit 502 (e.g. similar to segments 404 and 406 of data unit 400 of FIG. 4).

As illustrated in the example, a host may issue a read command with a host read scope 506 including segments 2 through 71 of data unit 502. During the read operation, information for segments that have been recovered by the inner code (e.g. a sector based code such as an LDPC code) may be sent to the OC syndrome block 504. As discussed in more detail below, the numbers inside the OC syndrome block 504 may represent the status of the syndrome block and may indicate the segments that have contributed to the syndrome state.

In some cases, the channel may be configured to read all the segments in the data unit 502 or OC block, including segments outside the host read scope 506. In other cases, the channel may initially be configured to read the segments within the host read scope 506. If, for example, the channel fails to recover one or more segments and the channel logic decides to perform OC recovery, the channel may be configured to extend the read operation to segments of the data unit 502 that are outside of the host read scope 506. The latter case will be used in the example below. As such, the read operation may begin at segment 2 514 instead of segment 1 512.

During the read operation, the segments 508 recovered after the read are shown without hatching (e.g. segment 1 512) and segments 510 for which the read failed are shown with cross hatching (e.g. segment 4 514).

In an example read, the read operation may begin at and successfully recover segment 2. Data for segment 2 may be sent to and applied to the OC syndrome block 504. The read operation may then fail to recover segments 3 and 4. The samples of segments 3 and 4 may be buffered for deferred decoding and data for segments 3 and 4 may not be sent to the OC syndrome block 504 (e.g. the update may be prevented because the segments failed). The read operation may continue and recover segments 5-10 and the data for segments 5-10 may be sent to and applied to the OC syndrome block 504. The read operation may then fail to recover segment 11 516, succeed in recovering segments 12 and 13 and fail to recover segment 14. Segments 12 and 13 may be treated similarly to segment 2 and segments 11 516 and 14 may be treated similarly to segment 4. As mentioned above, the read may be extended from the host read scope 506 to the entire outer code block or track, for example, due to the number of failed data segments. As such, the read process may continue to the end of the data unit and include segment 1 512. During the extended read, the recovery of segments 16 518, 20 520, 66 522, 70 524, 72 526 and 76 528 may fail while the remaining segments between segments 15 and the end of the data unit 502 (e.g. EOD) and segment 1 512 may be recovered and the data for the recovered segments 508 may be sent to and applied to the OC syndrome block 504.

Additionally, deferred decoding may recover segments 3 and 14 based on buffered samples. The data for segments 3 and 14 may then be sent and applied to the OC syndrome block 504. In some cases, the buffer for deferred decoding may have limited capacity. In the illustrated example, the buffer may have filled to capacity after storing samples for segment 14. As such, deferred decoding may not be applied to failed segments 16 518 through 76 528.

The channel may then attempt to perform various recovery attempts.

Figure 6:
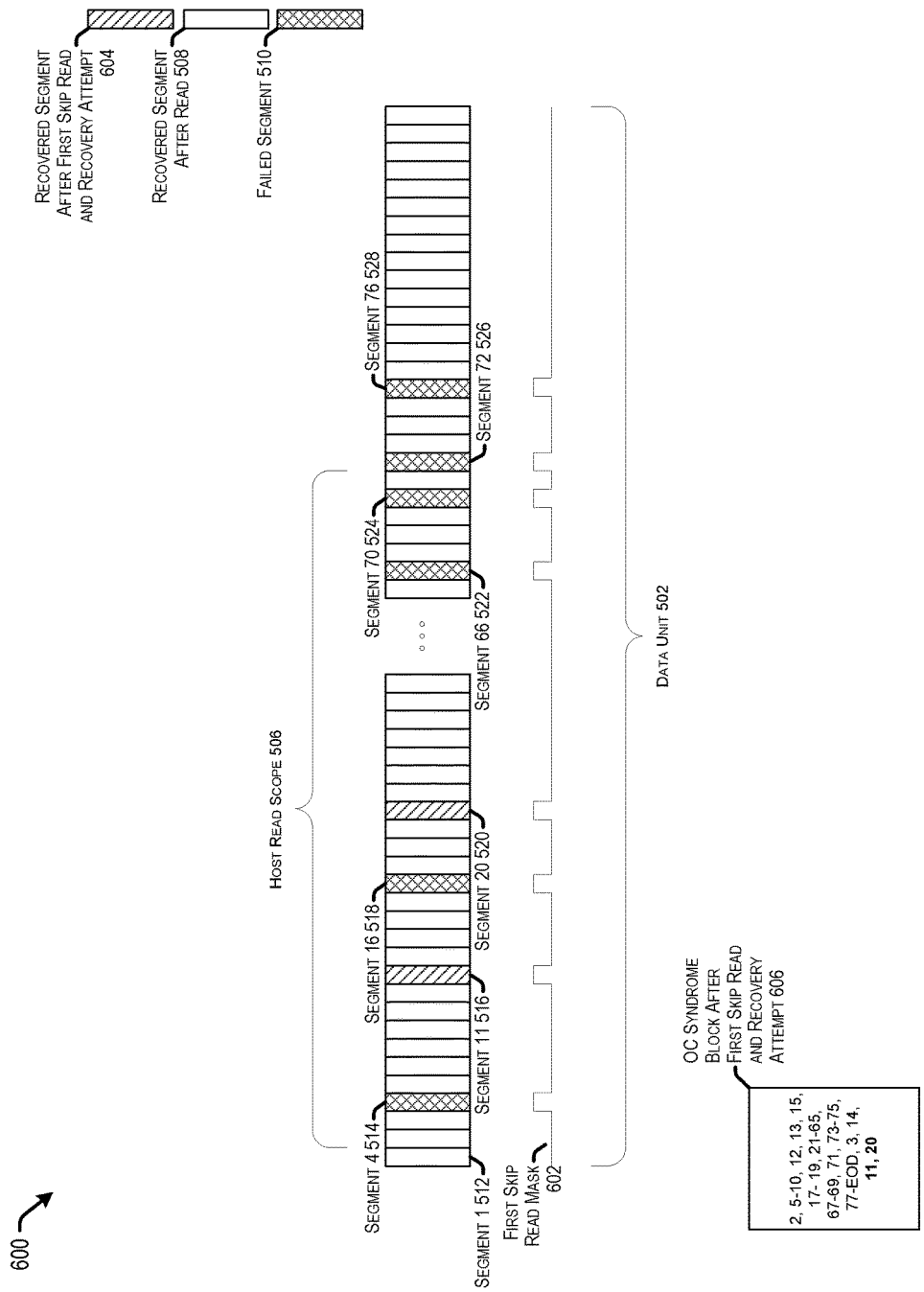
FIG. 6 illustrates a diagrammatic view of an embodiment of a data unit and an OC syndrome block, in accordance with certain embodiments of the present disclosure.

FIG. 6 illustrates a diagrammatic view 600 of an embodiment of a data unit 502 and an OC syndrome block 504 after a first skip read and recovery attempt. For example, the channel may perform a recovery operation to recover the remaining sectors via an offset read that positions the read head at a specified offset location in the track (e.g. offset from the read position used with regard to FIG. 5).

As illustrated, an offset read recovery operation may apply a first skip read mask 602 to skip recovered segments and read segments not recovered after the read and deferred decoding operations discussed above with regard to FIG. 5 (e.g. segments 4 514, 11 516, 16 518, 20 520, 66 522, 70 524, 72 526 and 76 528). Following the first skip read and the recovery attempt based on the offset read samples, the segments 604 recovered by the first skip read and the recovery attempt may be sent to and applied to the OC syndrome block 606 (which may correspond to OC syndrome block 504 after being updated with data from segments 604). As illustrated, segments 11 516 and 20 520 were recovered by the first skip read and the recovery attempt. As such, data for segments 11 and 20 may be sent to and applied to the OC syndrome block resulting in the illustrated state of the OC syndrome block 606.

Figure 7:
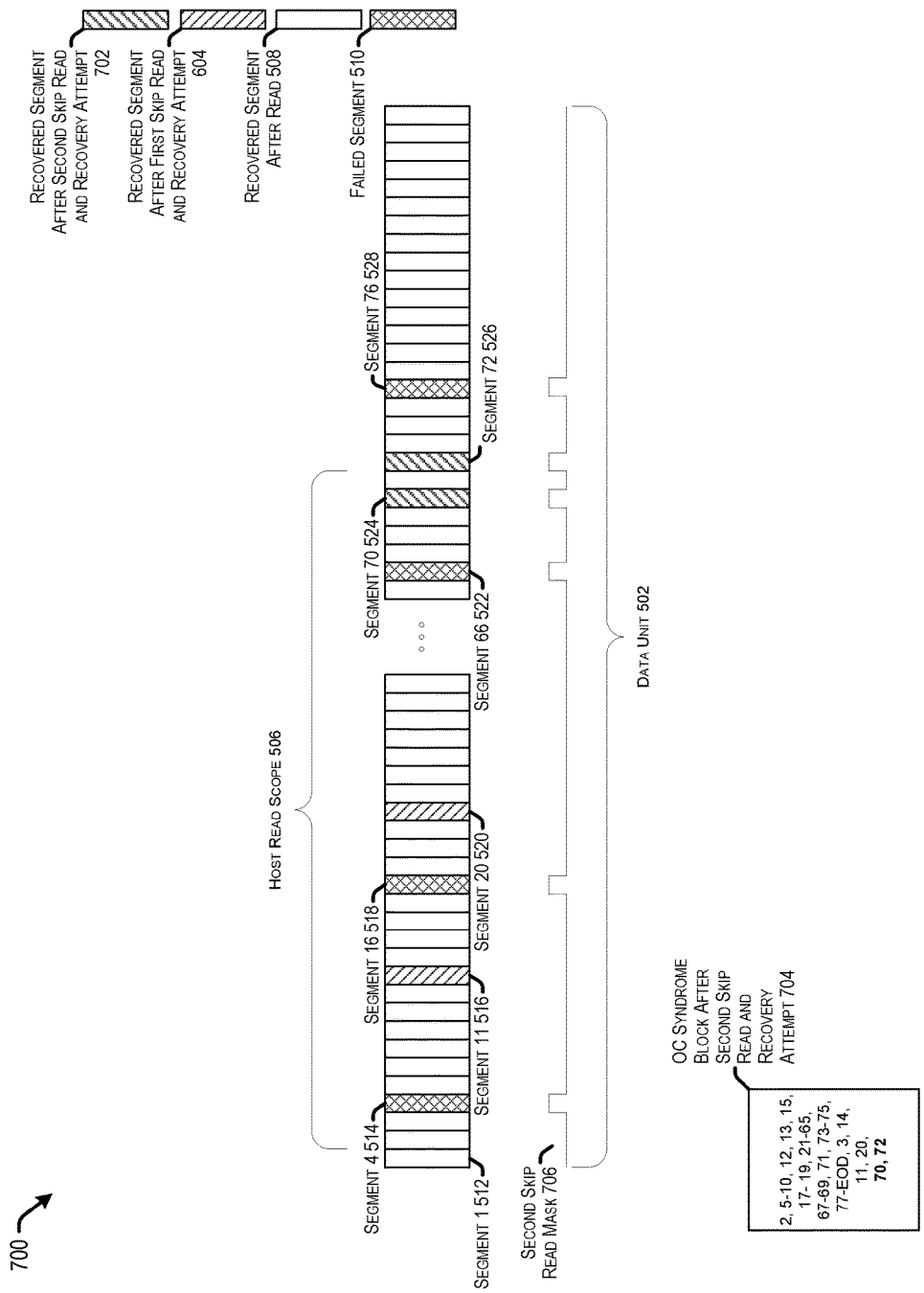
FIG. 7 illustrates a diagrammatic view of an embodiment of a data unit and an OC syndrome block, in accordance with certain embodiments of the present disclosure.

Similarly, FIG. 7 illustrates a diagrammatic view 700 of an embodiment of a data unit 502 and an OC syndrome block 704 after a second skip read and recovery attempt. For example, the channel may perform a recovery operation to recover the remaining segments via multi-sample averaging recovery (e.g. recovery based on samples resulting from averaging samples from multiple reads).

As illustrated, the second skip read and recovery operation may apply a second skip read mask 702 to skip recovered segments 508 and 604 and read segments not recovered after the first skip read and recovery attempt discussed above with regard to FIG. 6 (e.g. segments 4 514, 16 518, 66 522, 70 524, 72 526 and 76 528).

Following the second skip read and the recovery attempt using multi-sample averaging recovery, the segments 702 recovered by the second skip read and the recovery attempt may be sent to and applied to the OC syndrome block 704 (which may correspond to OC syndrome block 606 after being updated with data from segments 702). As illustrated, segments 70 524 and 72 526 were recovered by the second skip read and the recovery attempt. As such, data for segments 70 and 72 may be sent to and applied to the OC syndrome block resulting in the illustrated state of the OC syndrome block 704.

After the second skip read and the recovery attempt, segments 4 514, 16 518, 66 522 and 76 528 remain failed segments. The channel may then decide to perform an outer code recovery, such as IOC recovery, to recover these failed segments.

Figure 8:
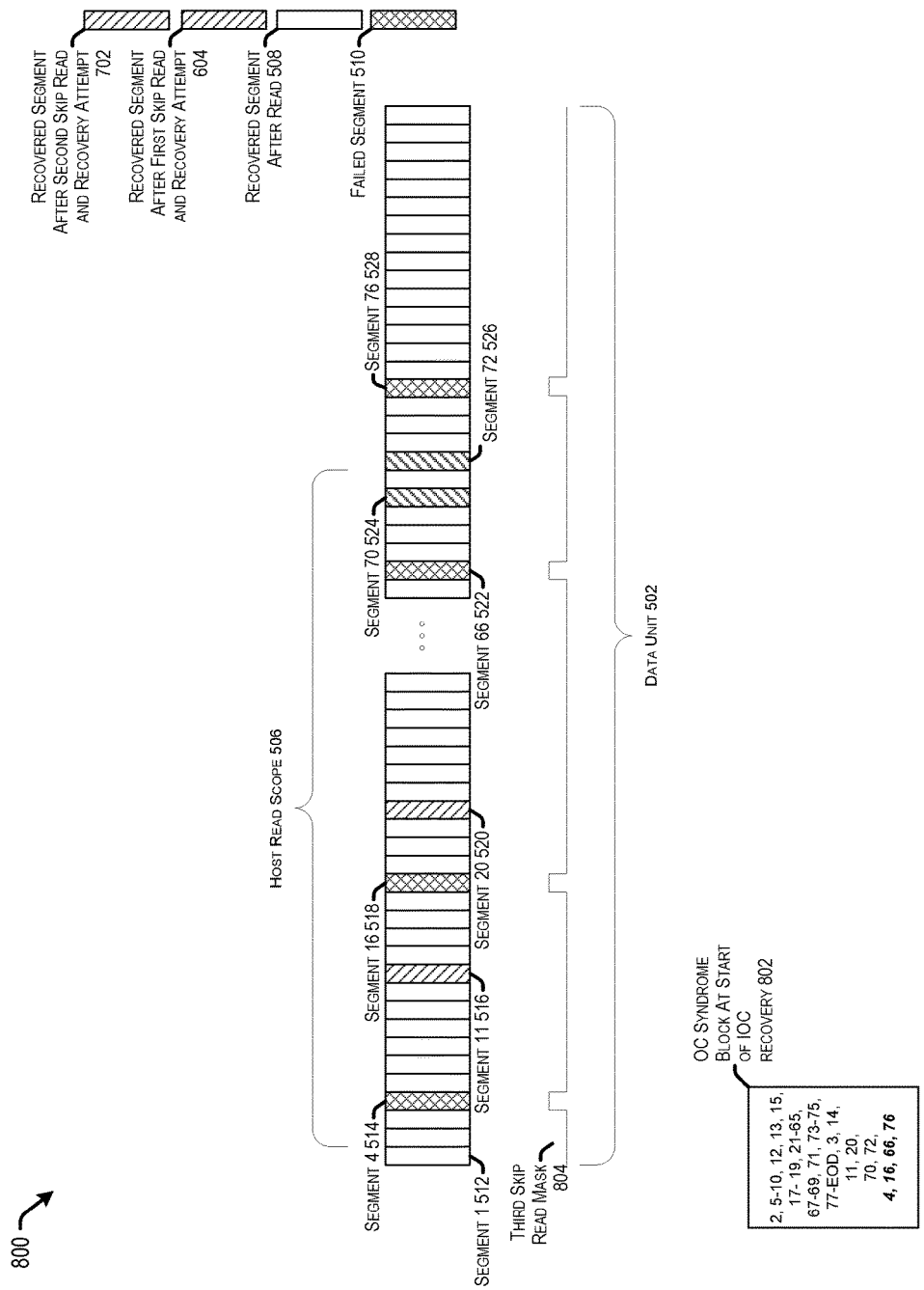
FIG. 8 illustrates a diagrammatic view of an embodiment of a data unit and an OC syndrome block, in accordance with certain embodiments of the present disclosure.

FIG. 8 illustrates a diagrammatic view 800 of an embodiment of a data unit 502 and an OC syndrome block 802 at a start of IOC recovery.

As illustrated, IOC recovery may begin with a third skip read which may apply a third skip read mask 804 to skip recovered segments 508, 604 and 702 and read segments not recovered after the second skip read and recovery attempt (e.g. segments 4 514, 16 518, 66 522 and 76 528).

The channel may then pass the failed data of segments 4 514, 16 518, 66 522 and 76 528 to the OC syndrome block resulting in the illustrated state of the OC syndrome block 802 which includes the contaminated data of the failed segments.

As IOC recovery is performed and recovers failed segments, the contaminated data of the failed segments may be constantly updated with data from the segments recovered by the IOC recovery. This may continue until either (a) IOC recovers the failed segments, in which case the contaminated data may be transformed into recovered data, or (b) the IOC process terminates after a certain time interval or number of iterations without recovering some of the failed segments.

Figure 9:
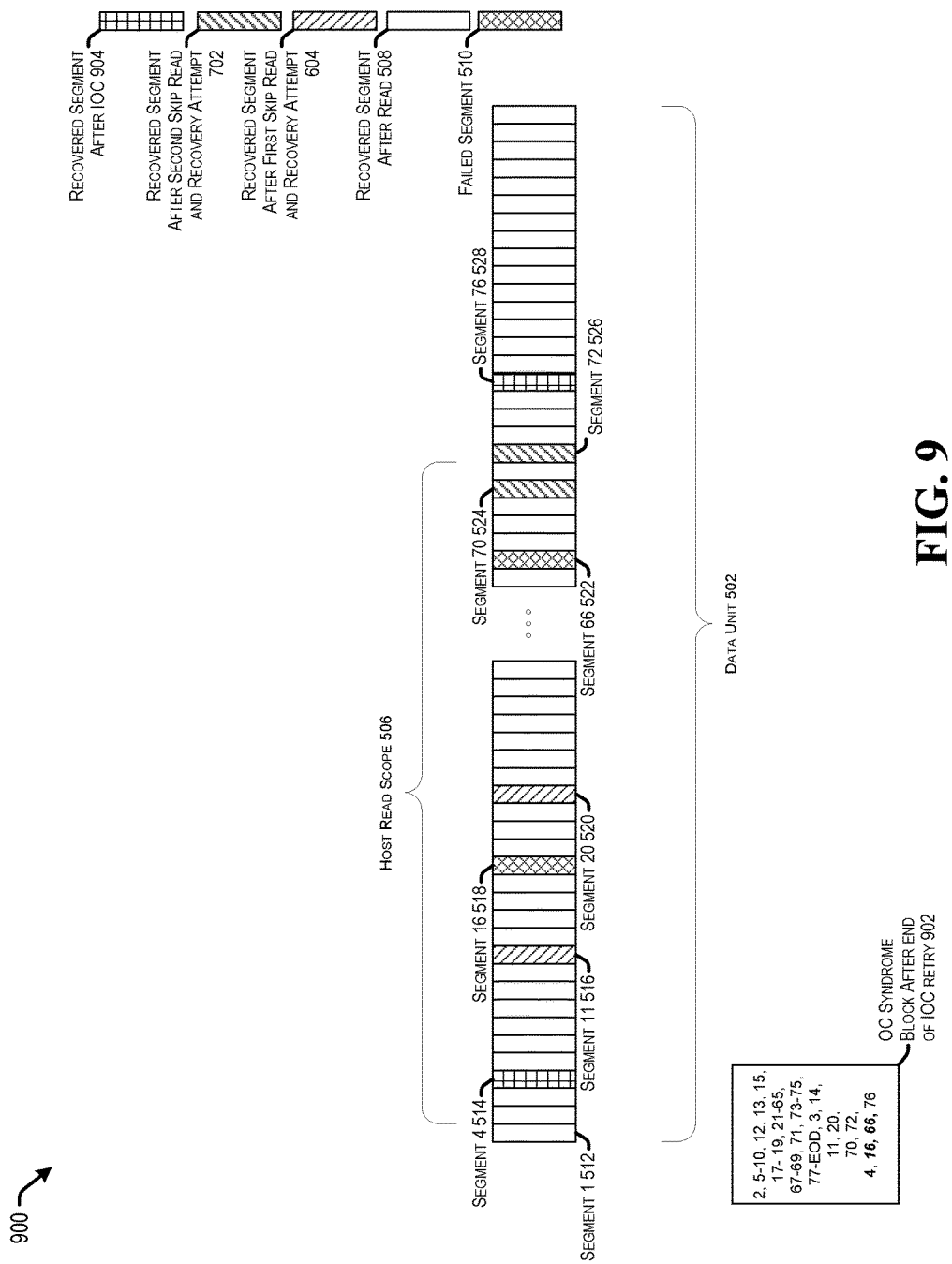
FIG. 9 illustrates a diagrammatic view of an embodiment of a data unit and an OC syndrome block, in accordance with certain embodiments of the present disclosure.

FIG. 9 illustrates a diagrammatic view 900 of an embodiment of a data unit 502 and an OC syndrome block 902 at an end of IOC recovery (which may correspond to OC syndrome block 802 after being updated with data from recovered segments 904).

As illustrated, the third skip read and the IOC recovery attempt recovered segments 4 514 and 76 528 but were unable to recover segments 16 518 and 66 522. As such, the contribution from the segments 904 (e.g. segments 4 514 and 76 528) may have been applied correctly to the OC syndrome block 902 but the OC syndrome block 902 may remain contaminated with bad data from failed segments 16 518 and 66 522. As such, if the channel were to invoke IOC or OC recovery, the IOC or OC recovery may not be possible due to the contamination.

Figure 10:
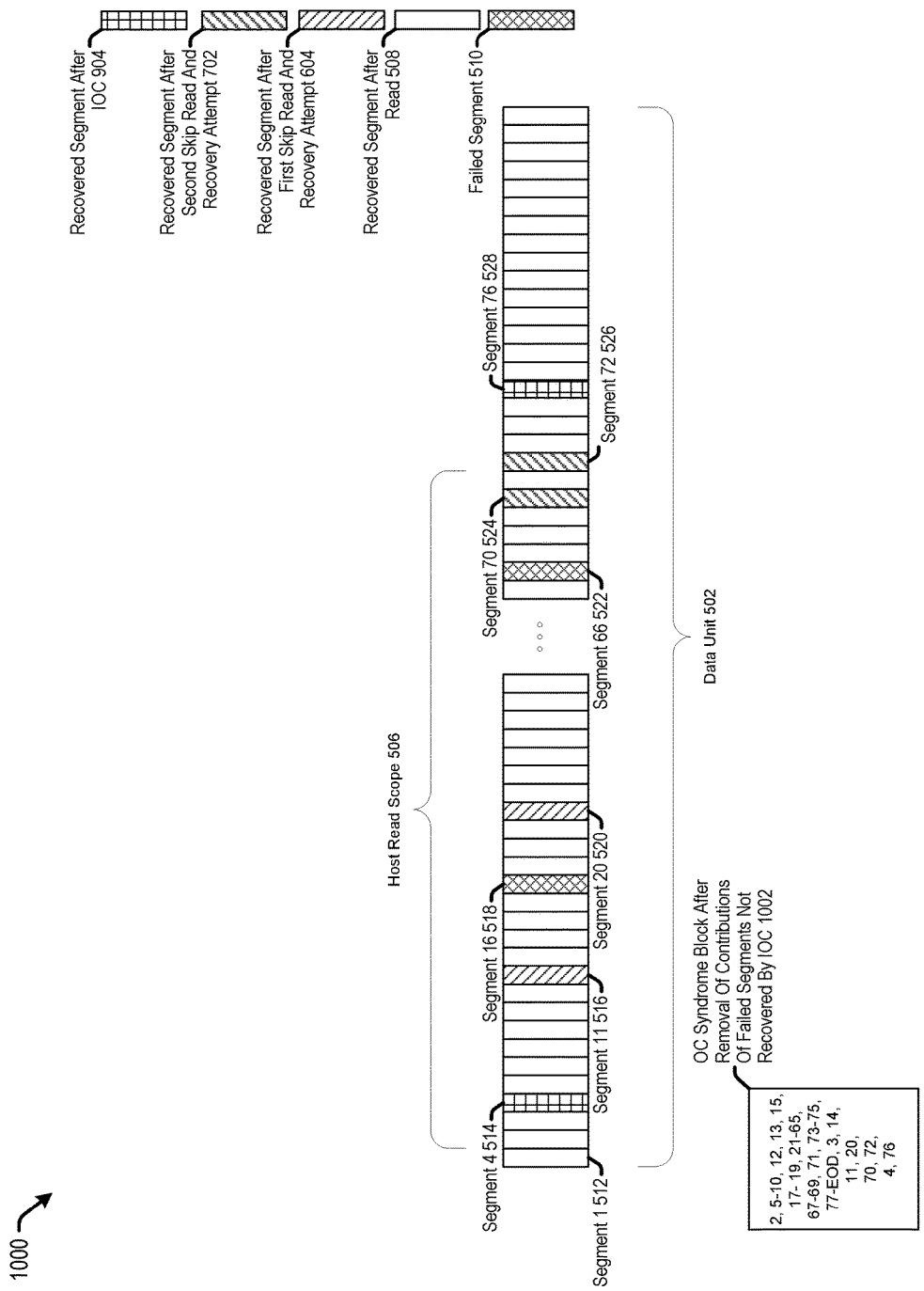
FIG. 10 illustrates a diagrammatic view of an embodiment of a data unit and an OC syndrome block, in accordance with certain embodiments of the present disclosure.

FIG. 10 illustrates a diagrammatic view 1000 of an embodiment of a data unit 502 and an OC syndrome block 1002 (which may correspond to OC syndrome block 902 after removal of contributions of failed segments not recovered by IOC recovery).

In some embodiments, the contamination of the OC syndrome block may be corrected by sending the bad data of segments 16 518 and 66 522 back to the OC syndrome block. For example, the bad data of segments 16 518 and 66 522 may be available in memory as part of the IOC recovery process and sent to the OC syndrome block after the IOC recovery process fails to recover the failed segments. As discussed above, applying the same data to an OC syndrome block twice (or an even number of times) may cancel the contribution of the data in the OC syndrome state (e.g. for modulo 2 addition in the OC syndrome).

As illustrated, the contributions of segments 16 518 and 66 522 may be removed from the state of the OC syndrome block 1002 which may return the state of the OC syndrome block 1002 to a good state that may be consistent with the data of the recovered segments at this point in the error recovery process.

As such, the channel may stage another attempt to recover segments 16 and 66, and later invoke OC recovery again if needed.

Figure 11:
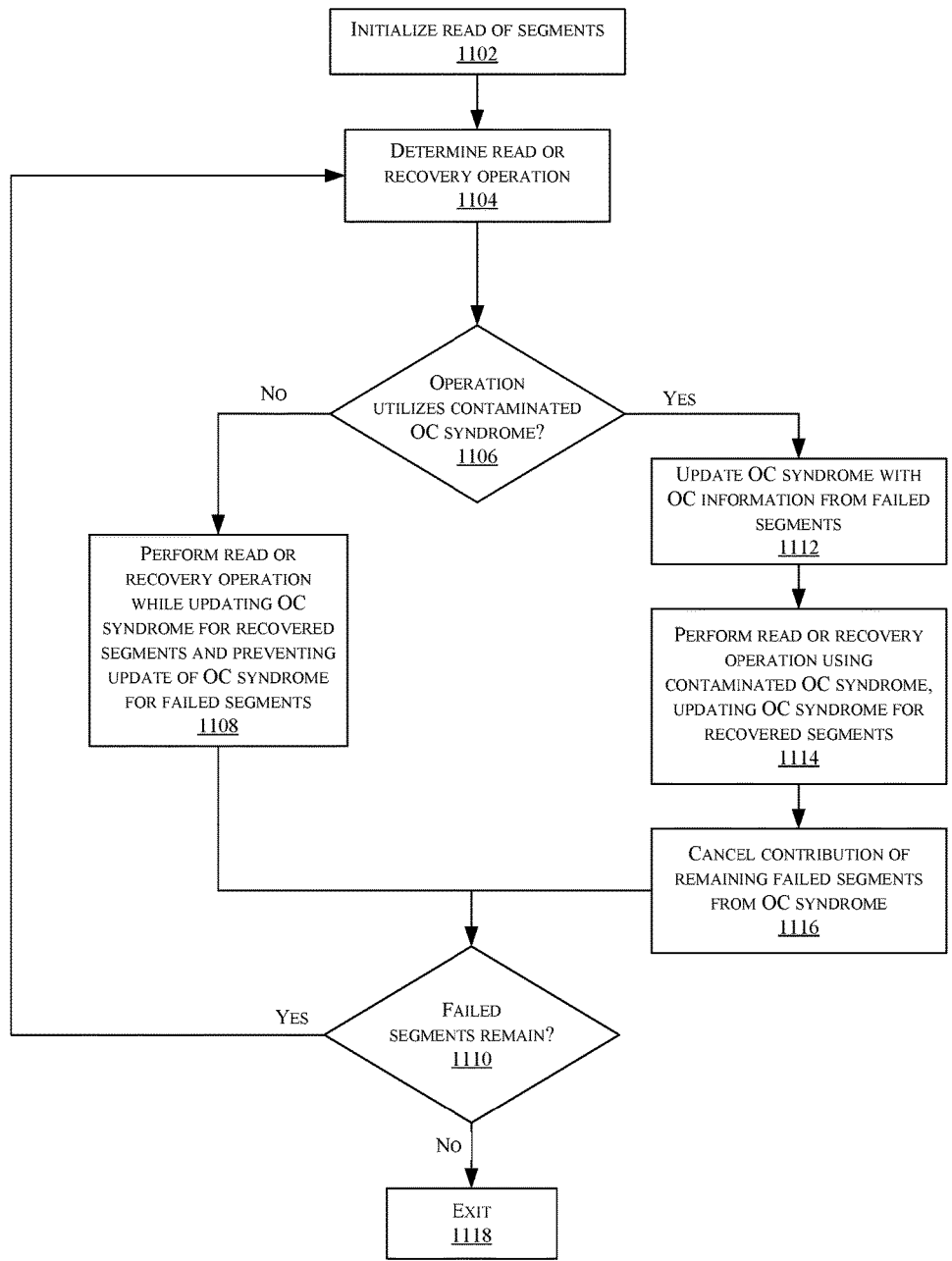
FIG. 11 is a flowchart illustrating a method of r updating and maintaining a syndrome state, in accordance with certain embodiments of the present disclosure.

FIG. 11 illustrates a method 1100 of updating and maintaining a syndrome state under some embodiments. More specifically, method 1100 may update and maintain the outer code syndrome during reads and various recovery processes so that, for example, the outer code syndrome need not be reconstructed prior to outer code recovery.

At 1102, a read of one or more segments of a data unit or outer code block may be initialized. At 1104, the read or recovery operation to be performed may be determined. Initially, the operation may be a read of a subset of or the entire data unit. In subsequent iterations, the read or recovery operation to be performed may be any read or recovery operation one of ordinary skill in the art would understand as applicable in view of this disclosure. Examples include inner code recovery operations such as deferred decoding, outer code recovery operation including IOC recovery and OC erasure recovery, offset read operations, multi-sample averaging processes, adjacent track interference cancellation (ATIC), missed address mark recovery (MAMR), sliding window erasure recovery, defect recoveries, etc.

At 1106, a determination may be made whether the current read or recovery operation utilizes a contaminated OC syndrome. As mentioned above, deferred decoding, offset read operations, and multi-sample averaging processes may not utilize a contaminated OC syndrome. On the other hand, IOC recovery may utilize a contaminated OC syndrome. If the current read or recovery operation does not utilize a contaminated OC syndrome, the process may continue to 1108. Otherwise, the process may continue to 1112.

At 1108, the current read or recovery operation may be performed while updating the OC syndrome with data from recovered segments and preventing updates of the OC syndrome with data from failed segments. The process may then continue to 1110.

At 1110, a determination may be made whether failed segments remain after the current read or recovery operation. If so, the process may return to 1104. Otherwise, the process may continue to 1118 and cease. In some examples, the determination at 1110 may also continue to 1118 after a threshold number of iterations without success.

Returning to 1106, the process may continue to 1112 when the current read or recovery operation utilizes a contaminated OC syndrome. At 1112, the OC syndrome may be updated with data from the failed segments. For example, contaminated data for the failed segments may be retrieved from memory and applied to the OC syndrome block or a skip read may be performed and the OC syndrome may be updated with data from the skip read without regard to whether the segment was recovered. At 1114, the current read or recovery operation may be performed using the contaminated OC syndrome. During the operation, the OC syndrome may be updated using data from any segments that is recovered be the current operation.

At 1116, the contribution of remaining failed segments may be cancelled from OC syndrome. As discussed above, the contamination of the OC syndrome block may be corrected by resending the bad data of the remaining failed segments to the OC syndrome block. For example, the bad data of the failed segments may be available in memory as part of an IOC recovery process and sent to the OC syndrome block after the IOC recovery process fails to recover the failed segments. As discussed above, applying the same data to OC syndrome block twice (or an even number of times) may cancel the contribution of the data in the OC syndrome state (e.g. for modulo 2 addition in the OC syndrome). The process may then continue to 1110 and proceed as discussed above.

In addition to or instead of updating and maintaining the outer code syndrome during reads and various recovery processes so that, for example, the outer code syndrome need not be reconstructed prior to outer code recovery, some embodiments may handle segments having repeatable miscorrection events from the inner code decoder. In some examples, such repeatable miscorrection events may occur due to a specific weak write operation.

In some example embodiments, an error detection code may be embedded into the segment data to determine if the inner decoder miscorrected a segment. However, the error detection decoder may be preceded by a modulation decoder that may be outside of the data path between the inner decoder and the outer decoder to avoid error propagation during iterative outer code recovery. This may be because the modulation code may be a non-linear catastrophic code that may propagate errors when noisy data is sent to the modulation decoder, and the error detection parity may be computed prior to modulation encoding during write. As such, in some examples, when the inner decoder miscorrects data and incorrectly determines the segment to have been recovered, the outer code syndrome may be contaminated before the error is detected by the error detection code (that may be after the modulation decoder) despite the channel being configured to prevent updates to the OC syndrome based on failed segments. The application of the miscorrected segment data to the OC syndrome block may prevent outer code recovery until the syndrome state is restored.

In some examples, when a miscorrection is detected, the channel may clear the outer code syndrome state and reissue the same read command from its start. If the same segment miscorrects repeatedly (e.g. a threshold number R times), the channel may clear the syndrome (e.g. reset or discard the state of the syndrome), add the miscorrection prone segments to a list of skipped segments and issue a read that skips the skipped segments. This process may be reapplied if other segments in the outer code block also miscorrect. Once the read of the segments of the outer code block is complete, error recovery may be performed for segments which are not included in the skipped segment list. When all the other segments of the outer code block have been recovered, the outer code may be used to reconstruct the miscorrection prone sector(s) via erasure recovery or other recovery processes.

Figure 12:
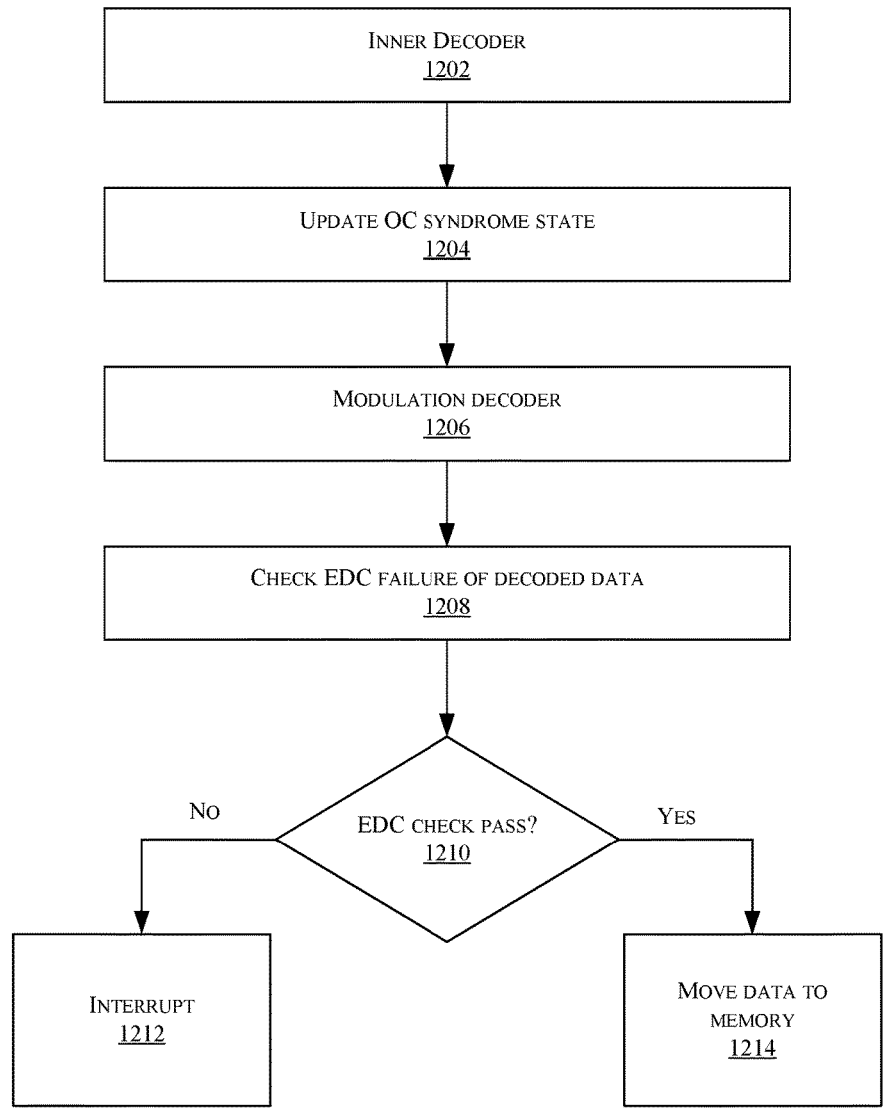
FIG. 12 illustrates an example data flow of an embodiment in which a modulation decoder may be outside of a data path between an inner decoder and an outer decoder, in accordance with certain embodiments of the present disclosure.

FIG. 12 illustrates an example data flow 1200 of an embodiment in which the modulation decoder may be outside of the data path between the inner decoder and the outer decoder.

In particular, at 1202, the inner decoder may perform inner decoding of the data. At 1204, for segments determined by the inner decoder to have been recovered, the OC syndrome may be updated. At 1206, the modulation decoder may perform modulation decoding. At 1208, a check may be performed for an error detection and correction (EDC) failure of the decoded data based on the output of the modulation decoder. At 1210, if the EDC check passed, the data flow continues to 1214 where the data may be moved to memory. Otherwise, the process continues to 1212 where an interrupt may be triggered. An example process for handling the interrupt is illustrated in FIG. 13.

Figure 13:
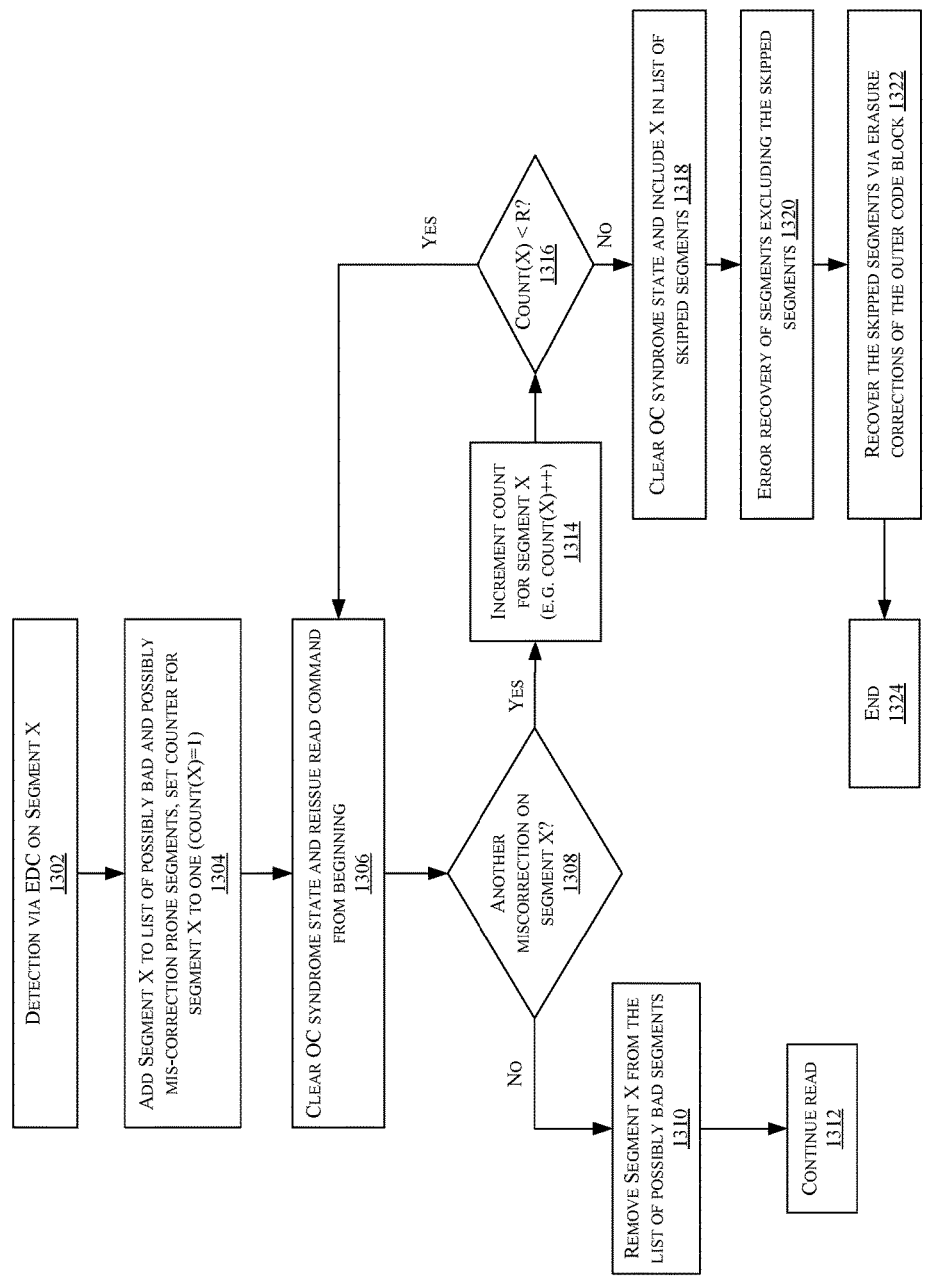
FIG. 13 is a flowchart illustrating a method of handling segments having repeatable miscorrection events, in accordance with certain embodiments of the present disclosure.

FIG. 13 illustrates a method 1300 of handling segments having repeatable miscorrection events in some embodiments.

At 1302, a miscorrection is detected via EDC on segment X (e.g. triggering the interrupt at 1212). At 1304, segment X may be added to a list of possibly bad and possibly miscorrection prone segments. A counter for segment X (e.g. a count of miscorrections for segment X) may be set to one (count(X)=1).

At 1306, the OC syndrome state may be cleared and a command may be issued to restart the read from the beginning.

At 1308, a determination may be made whether another miscorrection occurred on segment X during the re-read. If not, the process may continue to 1310. Otherwise, the process may continue to 1322. The determination at 1308 may, for example, be triggered by an interrupt after the new read reaches and processes segment X. In other cases, a determination of whether the count of failures of segment X is zero may occur prior to 1302 and the process may begin at 1308 if the count is not zero.

At 1310, since another miscorrection of segment did not occur, segment X may be removed from the list of possibly bad segments. The process may continue to 1312 at which the read may continue.

Returning to 1308, if another miscorrection occurred on segment X during the re-read, the process may continue to 1314. At 1314, the count of miscorrections for segment X may be incremented (e.g. count(X)++). At 1316, a determination may be made whether the miscorrection count for segment X is less than a threshold value R (e.g. count(X)<R). If so, the process returns to 1306 as described above. Otherwise, the process may continue to 1318.

At 1318, the OC syndrome state may be cleared and segment X may be added to a list of segments to skip in further reads. A skip read may then be issued which skips segments included in the list of skipped segments including segment X.

The process may then continue, with other segments potentially being processed and being added to the list of skipped segments. Once the read has been completed without miscorrection, the process may continue to 1320.

At 1320, error recovery may be performed for any failed segments, excluding the segments included in the list of skipped segments. Next, at 1322, the skipped segments may be recovered via erasure recovery of the outer code block or other recovery processes.

At 1324, once the recovery processes have been completed, the read process may complete.

Many variations would be apparent in view of this disclosure. For example, while the above discussion was primarily in the context of magnetic storage media such as hard disc drives, the systems and techniques disclosed herein are applicable many other storage technologies such as flash drives, hybrid drives, and so on. In addition, the data units/outer code blocks discussed herein may be tracks, collection of tracks, collection of sectors in multiple tracks, hybrid blocks that may include intermediate parity sectors in memory with user sectors on media, pages, blocks, dies, planes, or the like in a flash drive, and so on. Components and circuits used to perform the operations in the method may be discrete, integrated into a system on chip (SOC), or other circuits. Further, the steps can be carried out in a processor (e.g. a digital signal processor), implemented in software, implemented via firmware, or by other means.

The illustrations, examples, and embodiments described herein are intended to provide a general understanding of the structure of various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. For example, the figures and above description provide examples of architecture and voltages that may be varied, such as for design requirements of a system. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above examples, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. An apparatus comprising:
   a data storage medium;
   a channel circuit configured to:
   perform, in response to a request from a host, a read from the data storage medium including receiving data of one or more data segments stored on the data storage medium;
   determine one or more of the read data segments were not recovered by the read; and
   perform one or more read and recovery operations for the one or more data segments stored on the data storage medium including:
   updating an outer code syndrome for one or more recovered data segments recovered by the one or more read and recovery operations;
   if one or more failed data segments were not recovered by the one or more read and recovery operations, preventing update of the outer code syndrome for the one or more failed data segments not recovered by the one or more read and recovery operations; and
   if no failed data segments remain unrecovered by the one or more read and recovery operations, return the one or more recovered data segments recovered by the one or more read and recovery operations to the host.

2. The apparatus of claim 1, further comprising:
   the performing of the one or more read and recovery operations for the one or more data segments further including:
   for a first recovery operation of the one or more read and recovery operations, preventing update of the outer code syndrome for a previously recovered data segment recovered by a second operation of the one or more read and recovery operations performed after the first recovery operation.

3. The apparatus of claim 2, further comprising:
   the performing of the preventing of the updating of the outer code syndrome for the previously recovered data segment including skipping the previously recovered data segment in a read associated with the first recovery operation.

4. The apparatus of claim 1, further comprising the circuit configured to, for another recovery operation:
   update the outer code syndrome based on data from failed data segments to generate a contaminated outer code syndrome;
   perform the other recovery operation based on the contaminated outer code syndrome including updating the contaminated outer code syndrome using data from one or more recovered data segments of the failed data segments which were recovered by the other recovery operation; and
   cancel a contribution of one or more failed segments which the other recovery operation failed to recover from the updated contaminated outer code syndrome to generate an uncontaminated outer code syndrome.

5. The apparatus of claim 4, further comprising the other recovery operation being iterative outer code recovery.

6. The apparatus of claim 4, further comprising the circuit configured to:
   determine that the other recovery operation utilizes a contaminated outer code syndrome; and
   perform the updating to generate the contaminated outer code syndrome and the canceling to generate the an uncontaminated outer code syndrome in response to determining that the other recovery operation utilizes a contaminated outer code syndrome.

7. The apparatus of claim 4, further comprising the circuit further configured to:
   perform the cancelling of the contribution of the one or more failed segments which the other recovery operation failed to recover from the updated contaminated outer code syndrome by reapplying data corresponding to the one or more failed segments which the other recovery operation failed to recover to the updated contaminated outer code syndrome.

8. The apparatus of claim 7, further comprising the outer code syndrome being a syndrome of an outer code block for one or more of a track, a collection of tracks, a collection of sectors in multiple tracks, one or more hybrid blocks, a page, a block, a die, and a plane.

9. An apparatus comprising:
   a data storage medium;
   a channel circuit configured to:
   perform, in response to a request from a host, a read from the data storage medium including receiving data of one or more data segments stored on the data storage medium;
   determine one or more of the read data segments were not recovered by the read; and
   perform one or more read and recovery operations for the one or more data segments stored on the data storage medium including:
   update an uncontaminated outer code syndrome associated with one or more requested data segments based on data from failed data segments to generate a contaminated outer code syndrome;

perform a recovery operation based on the contaminated outer code syndrome including updating the contaminated outer code syndrome using data from one or more recovered data segments of the failed data segments which were recovered by the recovery operation; and if one or more failed data segments were not recovered by the recovery operation based on the contaminated outer code syndrome, cancel a contribution of one or more failed segments which the recovery operation failed to recover to generate an updated uncontaminated outer code syndrome; and if no failed data segments remain unrecovered by the recovery operation based on the contaminated outer code syndrome, return the one or more recovered data segments recovered by the one or more read and recovery operations to the host.

10. The apparatus of claim 9, further comprising the uncontaminated outer code syndrome being an outer code syndrome including one or more contributions corresponding to one or more previously recovered data segments and not including contributions from failed data segments.

11. The apparatus of claim 9, further comprising the recovery operation being iterative outer code recovery.

12. The apparatus of claim 9, further comprising the circuit further configured to:

determine that the recovery operation utilizes a contaminated outer code syndrome; and perform the updating to generate the contaminated outer code syndrome and the canceling to generate the updated uncontaminated outer code syndrome in response to determining that the recovery operation utilizes a contaminated outer code syndrome.

13. The apparatus of claim 9, further comprising the circuit further configured to:

perform the cancelling of the contribution of the one or more failed segments which the recovery operation failed to recover from the updated contaminated outer code syndrome by reapplying data corresponding to the one or more failed segments which the recovery operation failed to recover to the updated contaminated outer code syndrome.

14. The apparatus of claim 9, further comprising the circuit further configured to:

perform one or more other read and recovery operations for the one or more requested data segments including:

updating the updated uncontaminated outer code syndrome for one or more recovered data segments recovered by the one or more other read and recovery operations; and preventing update of the updated uncontaminated outer code syndrome for one or more failed data segments not recovered by the one or more other read and recovery operations.

15. The apparatus of claim 14, further comprising:

the performing of the one or more other read and recovery operations for the one or more data segments further including:

for a first recovery operation of the one or more other read and recovery operations, preventing update of the updated uncontaminated outer code syndrome for a previously recovered data segment recovered by a second operation of the one or more other read and recovery operations performed after the first recovery operation.

16. The apparatus of claim 15, further comprising:

performing the preventing of updating of the updated uncontaminated outer code syndrome for the previously recovered data segment including skipping the previously recovered data segment in a read associated with the first recovery operation.

17. An apparatus comprising:

a data storage medium;

a channel circuit configured to:

perform, in response to a request from a host, a read from the data storage medium including receiving data of one or more data segments stored on the data storage medium;

perform, by an inner decoder, inner decoding of the data read from the storage medium including the one or more data segments;

update, by an outer decoder, an outer code syndrome for one or more recovered data segments determined by the inner decoder to have been recovered;

perform, by a modulation decoder, modulation decoding;

detect an initial miscorrection of a miscorrected data segment of the one or more data segments based on the modulation decoding;

add the miscorrected data segment to a list of data segments that are potentially miscorrection prone in response to the initial miscorrection of the miscorrected data segment;

initialize a read operation to read one or more requested data segments of a respective data unit including the miscorrected data segment of the one or more requested data segments of the respective data unit; and when a miscorrection of the miscorrected data segment is detected based on the read operation, add the miscorrected data segment to a list of data segments to be skipped based at least in part on a number of miscorrections of the miscorrected data segment;

when the miscorrection of the miscorrected data segment is not detected based on the read operation:

remove the miscorrected data segment from the list of data segments that are potentially miscorrection prone; and return the data of the miscorrected data segment to the host.

18. The apparatus of claim 17, further comprising the circuit further configured to:

detect the miscorrection of the miscorrected data segment; and update a count of miscorrections of the miscorrected data segment in response to the detection of the miscorrection of the miscorrected data segment.

19. The apparatus of claim 18, further comprising the circuit further configured to:

perform the addition of the miscorrected data segment to the list of data segments to be skipped based on the count of miscorrections of the miscorrected data segment and a threshold number;

clear an outer code syndrome associated with the read in response to the detection of the miscorrection of the miscorrected data segment; and issue a skip mask read that skips data segments of the respective data unit that are included in the list of data segments to be skipped.

20. The apparatus of claim 17, further comprising the circuit further configured to:

recover one or more data segments in the list of data segments to be skipped using one of iterative outer code recovery and erasure recovery.

* * * * *